(12) United States Patent
Tani

(10) Patent No.: US 10,187,038 B2
(45) Date of Patent: Jan. 22, 2019

(54) RESONANT CIRCUIT AND HIGH-FREQUENCY FILTER

(71) Applicant: Murata Manufacturing Co., Ltd., Kyoto (JP)

(72) Inventor: Masakazu Tani, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 190 days.

(21) Appl. No.: 15/079,287

(22) Filed: Mar. 24, 2016

(65) Prior Publication Data

US 2016/0204763 A1 Jul. 14, 2016

Related U.S. Application Data

(63) Continuation of application No. PCT/JP2014/073443, filed on Sep. 5, 2014.

(30) Foreign Application Priority Data

Sep. 26, 2013 (JP) .................................. 2013-199161

(51) Int. Cl.
*H03H 9/52* (2006.01)
*H03H 9/54* (2006.01)
(Continued)

(52) U.S. Cl.
CPC .............. *H03H 9/542* (2013.01); *H03H 5/12* (2013.01); *H03H 9/568* (2013.01); *H03H 9/64* (2013.01);
(Continued)

(58) Field of Classification Search
CPC .......... H03H 5/12; H03H 9/542; H03H 9/568; H03H 9/64; H03H 9/6403; H03H 9/6483; H03H 2009/02165
(Continued)

(56) References Cited

U.S. PATENT DOCUMENTS 5,291,159 A    3/1994  Vale
7,135,940 B2   11/2006 Kawakubo et al.
(Continued)

FOREIGN PATENT DOCUMENTS

CN    1496000 A      5/2004
CN    102725959 A    10/2012
(Continued)

OTHER PUBLICATIONS

English translation of Written Opinion for PCT/JP2014/073443 dated Dec. 9, 2014.
(Continued)

*Primary Examiner* — Robert J Pascal
*Assistant Examiner* — Jorge Salazar, Jr.
(74) *Attorney, Agent, or Firm* — Pearne & Gordon LLP

(57) ABSTRACT

A resonant circuit includes a resonator. An inductor is connected in parallel with the resonator. An inductor is connected in series with the parallel circuit formed of the resonator and the inductor. Further, a variable capacitor is connected in parallel with a series circuit formed of the inductor and the parallel circuit formed of the resonator and the inductor. The variable capacitor is connected in series with these circuits. As a result, a resonant circuit and a high-frequency filter supporting more communication signals are provided.

7 Claims, 8 Drawing Sheets

(51) Int. Cl.
*H03H 5/12* (2006.01)
*H03H 9/56* (2006.01)
*H03H 9/64* (2006.01)
*H03H 9/02* (2006.01)

(52) U.S. Cl.
CPC ........ *H03H 9/6403* (2013.01); *H03H 9/6483* (2013.01); *H03H 2009/02165* (2013.01)

(58) Field of Classification Search
USPC .......................... 333/133, 187, 188, 193–196
See application file for complete search history.

(56) References Cited

U.S. PATENT DOCUMENTS

| | | |
|---|---|---|
| 7,741,930 B2 | 6/2010 | Inoue et al. |
| 8,330,558 B2 | 12/2012 | Inoue et al. |
| 8,552,818 B2 | 10/2013 | Kadota et al. |
| 8,923,794 B2 | 12/2014 | Aigner |
| 2004/0058664 A1 | 3/2004 | Yamamoto et al. |
| 2005/0212612 A1 | 9/2005 | Kawakubo et al. |
| 2007/0046394 A1 | 3/2007 | Inoue et al. |
| 2010/0134203 A1 | 6/2010 | Inoue et al. |
| 2011/0063051 A1* | 3/2011 | Fedan ................. H03H 9/6406 333/195 |
| 2012/0286900 A1 | 11/2012 | Kadota et al. |
| 2013/0109332 A1 | 5/2013 | Aigner |

FOREIGN PATENT DOCUMENTS

| | | |
|---|---|---|
| JP | 2002-299997 A | 10/2002 |
| JP | 2005-217852 A | 11/2005 |
| JP | 2007-181147 A | 7/2007 |
| JP | 2007-060412 A | 8/2007 |
| JP | 2013-098991 A | 5/2013 |
| KR | 2012-0096108 A | 8/2012 |
| WO | 2011093449 A1 | 8/2011 |

OTHER PUBLICATIONS

Written Opinion for PCT/JP2014/073443 dated Dec. 9, 2014.
International Search report for PCT/JP2014/073443 dated Dec. 9, 2014.

* cited by examiner

RESONANT CIRCUIT AND HIGH-FREQUENCY FILTER

BACKGROUND

Technical Field

The present disclosure relates to a resonant circuit including a resonator having a resonant point and an anti-resonant point, and to a high-frequency filter including the resonant circuit.

Communication apparatuses in recent years have been performing communication in various frequency bands. Hence, a communication apparatus includes a plurality of filters supporting a plurality of frequency bands, and the filters are switched among for different communication signals. As such a filter, a tunable filter (variable filter) is desired which allows the band-pass characteristics to be variable over a wider frequency band and allows a plurality of communication signals to be processed using a single filter.

Patent Document 1 discloses a configuration of a T-type variable filter having two resonators. The variable filter disclosed in Patent Document 1 includes two resonators connected in series between the input and output of a T-type circuit, inductors respectively connected in parallel with the resonators, and two variable capacitors respectively connected in series between the input terminal and one of the resonators and between the output terminal and the other of the resonators. The resonant frequencies of the respective resonators are made to be variable by setting in advance the values of the inductors connected in parallel with the two resonators such that the resonators have desired resonant frequencies, and by adjusting the variable capacitors so as to satisfy band-pass characteristics required for the variable filter.

Patent Document 1: U.S. Pat. No. 5,291,159

BRIEF SUMMARY

However, in Patent Document 1, the band-pass characteristics of a variable filter are adjusted mainly by moving the resonant frequency of a resonator. Hence, in the variable filter of Patent Document 1, a frequency range over which the center frequency of the pass band, in the transmission characteristics, can be adjusted is limited. On the other hand, communication signals currently used in wireless communication have various frequency bands, but with the technique disclosed in Patent Document 1, a variable filter supporting more communication signals cannot be formed.

The present disclosure provides a resonant circuit and a high-frequency filter that can support more communication signals.

A resonant circuit according to the present disclosure includes: a resonator, a first inductor, and a first variable capacitor connected in series with one another; a second inductor connected in parallel with the resonator; and a second variable capacitor connected in parallel with the resonator and the first inductor connected in series with each other.

A resonant circuit according to the present disclosure includes: a resonator, a first inductor, and a first variable capacitor connected in series with one another; a second inductor connected in parallel with the resonator and the first inductor connected in series with each other; and a second variable capacitor connected in parallel with the resonator, the first inductor, and the first variable capacitor connected in series with one another.

A resonant circuit according to the present disclosure includes: a resonator, a first inductor, and a first variable capacitor connected in series with one another; a second inductor connected in parallel with the resonator; and a second variable capacitor connected in parallel with the resonator, the first inductor, and the first variable capacitor connected in series with one another.

A resonant circuit according to the present disclosure includes: a resonator, a first inductor, and a first variable capacitor connected in series with one another; a second inductor connected in parallel with the resonator and the first inductor connected in series with each other; and a second variable capacitor connected in parallel with the resonator and the first inductor connected in series with each other.

With these configurations, the first inductor and the second inductor are connected to the resonator, thereby increasing a distance between a resonant frequency and an anti-resonant frequency. Also, through connection of the first variable capacitor and the second variable capacitor, the distance between the resonant frequency and the anti-resonant frequency of the resonator is decreased. In other words, the resonant circuits allow both of the resonant frequency and the anti-resonant frequency of the resonator to be adjusted. As a result, by using the resonant circuits, desired band-pass characteristics and attenuation characteristics for a filter, for example, can be easily and accurately realized.

The resonator may be a surface acoustic wave resonator.

The resonator may be a bulk acoustic wave resonator.

According to the present disclosure, both of the resonant frequency and the anti-resonant frequency can be made to be variable, and a filter having desired band-pass characteristics and attenuation characteristics can be easily and accurately realized.

DETAILED DESCRIPTION

First Embodiment

Figure 1:
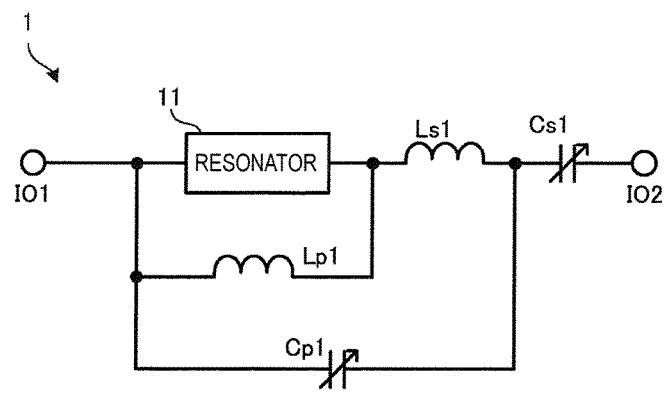
FIG. 1 is a circuit diagram of a resonant circuit according to a first embodiment.

FIG. 1 is a circuit diagram of a resonant circuit 1 according to a first embodiment.

The resonant circuit 1 includes input/output terminals IO1 and IO2. A resonator 11, an inductor Ls1, and a variable capacitor Cs1 are connected in series between the input/output terminals IO1 and IO2 in this sequence from the input/output terminal IO1 side. The inductor Ls1 corresponds to a first inductor according to the present disclosure, and the variable capacitor Cs1 corresponds to a first variable capacitor according to the present disclosure.

The resonator 11 is a device having a resonant point (resonant frequency) and an anti-resonant point (anti-resonant frequency) in the impedance characteristics. Specifically, the resonator 11 is a piezoelectric resonator, formed of, for example, a surface acoustic wave (SAW) device. The resonator 11 according to the present embodiment has a center frequency of 800 MHz and a characteristic impedance of 50Ω. Note that the resonator 11 may be a bulk acoustic wave (BAW) device (bulk acoustic wave resonator).

An inductor Lp1 is connected in parallel with the resonator 11. In more detail, one end of the inductor Lp1 is connected to the input terminal IO1, and the other end is connected to a connection node between the resonator 11 and the inductor Ls1. The inductor Lp1 corresponds to a second inductor according to the present disclosure.

A variable capacitor Cp1 is connected in parallel with the resonator 11 and the inductor Ls1 connected in series with each other. The variable capacitor Cp1 corresponds to a second variable capacitor according to the present disclosure.

Note that examples of variable-capacitance devices usable as the variable capacitors Cs1 and Cp1 include a variable-capacitance diode, a micro electromechanical system (MEMS) variable-capacitance device, and a variable-capacitance capacitor using ferroelectric layers of (Ba, Sr)TiO3 (BST).

In the present embodiment, the inductor Lp1 is connected in parallel with the resonator 11 (thereby forming a circuit hereinafter called a first parallel circuit in the present embodiment). With this configuration, the anti-resonant frequency of the resonator 11 can be preferentially adjusted to the high-frequency side. Further, in the present embodiment, the inductor Ls1 is connected in series with the first parallel circuit (thereby forming a circuit called a first series circuit in the present embodiment). With this configuration, the resonant frequency of the first parallel circuit can be preferentially adjusted to the low-frequency side.

In the present embodiment, the variable capacitor Cp1 is connected in parallel with the first series circuit (thereby forming a circuit hereinafter called a second parallel circuit in the present embodiment). With this configuration, the anti-resonant frequency of the first series circuit can be preferentially adjusted to the low-frequency side. Further, in the present embodiment, the variable capacitor Cs1 is connected in series with the second parallel circuit. With this configuration, the resonant frequency of the second parallel circuit can be preferentially adjusted to the high-frequency side. Note that the impedances of the resonant circuit 1 at the resonant frequency and anti-resonant frequency can be respectively adjusted by changing the capacitances of the variable capacitors Cp1 and Cs1.

Hereinafter, the adjustment method of adjusting the resonant frequency and anti-resonant frequency of the resonant circuit 1 according to the first embodiment will be described. In the resonant circuit 1 illustrated in FIG. 1, by connecting the inductor Lp1, the inductor Ls1, the variable capacitor Cp1, the variable capacitor Cs1 in this sequence to the resonator 11, the resonant frequency and anti-resonant frequency of the resonator 11 are adjusted.

Figure 2:
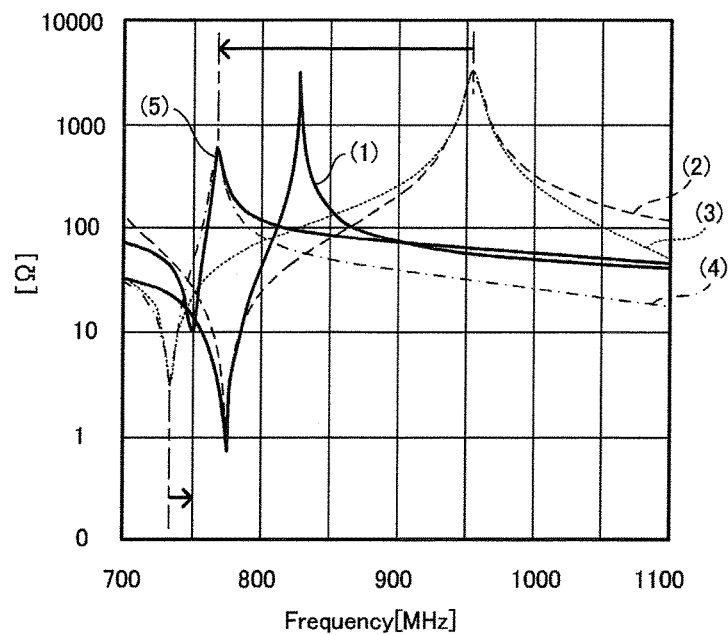
FIG. 2 is a diagram illustrating impedance characteristics in the case where devices are connected in sequence to a resonant circuit.

FIG. 2 is a diagram illustrating the impedance characteristics in the case where the devices are connected in sequence to the resonator 11. The horizontal axis of FIG. 2 represents frequency [MHz] and the vertical axis represents impedance [Ω].

A waveform (1) illustrated in FIG. 2 shows impedance characteristics in the case where only the resonator 11 is connected between the input/output terminals IO1 and IO2. The resonant frequency of the resonator 11 is about 775 MHz and the anti-resonant frequency is about 825 MHz.

A waveform (2) illustrates the impedance characteristics of the first parallel circuit in which the inductor Lp1 of 10 nH is connected in parallel with the resonator 11. By connecting an inductor in parallel with the resonator 11, the anti-resonant frequency of the resonator 11 is increased. In this first parallel circuit, the resonant frequency is about 775 MHz and the anti-resonant frequency is about 955 MHz. In other words, the waveform (2) has the same resonant frequency as and a higher anti-resonant frequency than the waveform (1). Further, in the present embodiment, the anti-resonant frequency can be adjusted to the high-frequency side in a state in which variation in impedance is small.

A waveform (3) shows the impedance characteristics of the first series circuit in which the inductor Ls1 of 10 nH is connected in series with the first parallel circuit. The resonant frequency of the first parallel circuit is lowered by connecting the inductor Ls1 in series with the first parallel circuit. In this first series circuit, the resonant frequency is about 730 MHz, and the anti-resonant frequency is about 955 MHz. In other words, the waveform (3) has the same anti-resonant frequency as and a lower resonant frequency than the waveform (2).

A waveform (4) shows the impedance characteristics of the second parallel circuit in which the variable capacitor Cp1 is connected in parallel with the first series circuit. The waveform (3) is a waveform in the case where the variable capacitor Cp1 is set to 5 pF. By connecting the variable capacitor Cp1 in parallel with the first series circuit, the anti-resonant frequency of the first series circuit is lowered. In the second parallel circuit, the resonant frequency is about 730 MHz, and the anti-resonant frequency is about 777 MHz. In other words, the waveform (4) has the same resonant frequency as and an about 178 MHz lower anti-resonant frequency than the waveform (3). By changing the capacitance of the variable capacitor Cp1, adjustment can be made in accordance with how much the anti-resonant frequency is to be lowered.

A waveform (5) illustrates the impedance characteristics of a circuit in which the variable capacitor Cs1 is connected in series with the second parallel circuit, i.e., the impedance characteristics of the resonant circuit 1 according to the first embodiment. The waveform (5) is a waveform corresponding to the case where the variable capacitor Cs1 is made to have a capacitance of 5 pF. By connecting a capacitor in series with the second parallel circuit, the resonant frequency of the second parallel circuit is increased. In the resonant circuit 1, the resonant frequency is about 751 MHz, and the anti-resonant frequency is about 777 MHz. In other words, the waveform (5) has the same anti-resonant frequency as and an about 19 MHz higher resonant frequency than the waveform (4). By changing the capacitance of the variable capacitor Cs1, adjustment can be made in accordance with how much the anti-resonant frequency is to be lowered.

When comparing the waveform (5) with the waveform (1), both the resonant frequency and anti-resonant frequency are lowered. In other words, the resonant circuit 1 allows both the resonant frequency and anti-resonant frequency of the resonator 11 to be varied. As a result, the resonant circuit 1 allows the band-pass characteristics and the attenuation characteristics to be adjusted.

Further, in the present embodiment, after increasing the distance between the resonant frequency and the anti-resonant frequency by connecting the inductors Lp1 and Ls1 to the resonator 11, the variable capacitors Cp1 and Cs1 are connected, and setting is performed through adjustment of the capacitance such that the resonant circuit 1 has a desired resonant frequency and a desired anti-resonant frequency within the above-described increased distance between the resonant frequency and the anti-resonant frequency, as indicated by the arrows in FIG. 2.

If only the anti-resonant frequency is moved in a state where the resonant frequency of the resonator 11 is fixed, i.e., in a state where the inductor Ls1 is not connected to the resonator 11, the anti-resonant frequency will not become lower than the resonant frequency of 775 MHz of the resonator 11. In the present embodiment, by lowering the resonant frequency of the resonator 11 through connection of the inductor Ls1, the anti-resonant frequency can be adjusted to 770 MHz which is lower than the resonant frequency of 775 MHz of the resonator 11.

Further, by connecting the inductor Lp1 to the resonator 11, a range over which the anti-resonant frequency can be varied is increased. Specifically, the anti-resonant frequency of the resonant circuit 1 to which the inductor Lp1 is connected can be adjusted over a range of about 955 MHz to about 777 MHz, whereas the anti-resonant frequency of the resonator 11 without the inductor Lp1 connected thereto can be adjusted only over a range of about 825 MHz to about 777 MHz.

In this way, the resonant frequency and the anti-resonant frequency which cannot be realized by the resonator 11 alone can be realized, and the resonant frequency and the anti-resonant frequency can be realized in a wider frequency band in the resonant circuit 1.

Further, a range over which the resonant frequency and the anti-resonant frequency of the resonator 11 can be varied by the variable capacitors Cp1 and Cs1 can be increased by increasing the distance between the resonant frequency and the anti-resonant frequency of the resonator 11 once.

In this way, in the present embodiment, the resonant circuit 1 which is suitable for more communication signals than in a resonator alone or an existing configuration can be more reliably realized. Note that the resonant circuit 1 according to the present embodiment, which can considerably change the anti-resonant frequency, is effective for a variable filter that allows the center frequency of a pass band or the band width to be changed, or allows the attenuation characteristics to be changed considerably.

Second Embodiment

Figure 3:
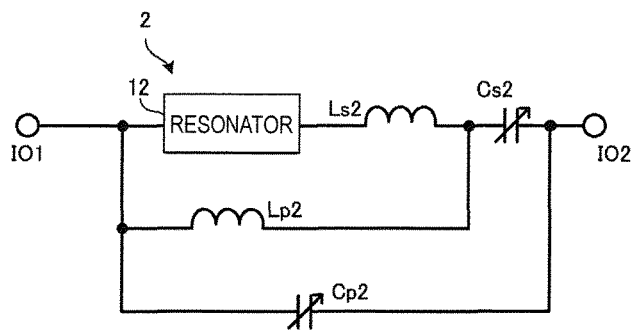
FIG. 3 is a circuit diagram of a resonant circuit according to a second embodiment.

FIG. 3 is a circuit diagram of a resonant circuit 2 according to a second embodiment.

A resonator 12, an inductor Ls2, and a variable capacitor Cs2 are connected in series between input/output terminals IO1 and IO2 of the resonant circuit 2 in this sequence from the input/output terminal IO1 side. The inductor Ls2 corresponds to the first inductor according to the present disclosure, and the variable capacitor Cs2 corresponds to the first variable capacitor according to the present disclosure.

An inductor Lp2 is connected in parallel with a series circuit (hereinafter called a first series circuit in the present embodiment) formed of the resonator 12 and the inductor Ls2. In more detail, one end of the inductor Lp2 is connected to the input terminal IO1 and the other end is connected to a connection node between the inductor Ls2 and the variable capacitor Cs2. The inductor Lp2 corresponds to the second inductor according to the present disclosure.

A variable capacitor Cp2 is connected in parallel with the first series circuit and the variable capacitor Cs2 connected in series with each other. The variable capacitor Cp2 corresponds to the second variable capacitor according to the present disclosure.

Note that the resonator 12, the inductors Ls2 and Lp2, and the variable capacitors Cs2 and Cp2 are devices which are respectively the same as the resonator 11, the inductors Ls1 and Lp1, and the variable capacitors Cs1 and Cp1 according to the first embodiment.

In the present embodiment, the inductor Ls2 is connected in series with the resonator 12. With this configuration, the resonant frequency of the resonator 12 can be preferentially adjusted to the low-frequency side. Further, in the present embodiment, the inductor Lp2 is connected in parallel with the first series circuit (thereby forming a circuit called a first parallel circuit in the present embodiment). With this configuration, the anti-resonant frequency of the first series circuit can be preferentially adjusted to the high-frequency side.

In the present embodiment, the variable capacitor Cs2 is connected in series with the first parallel circuit (thereby forming a circuit hereinafter called a second series circuit in the present embodiment). With this configuration, the resonant frequency of the first parallel circuit can be preferentially adjusted to the high-frequency side. Further, in the present embodiment, the variable capacitor Cp2 is connected in parallel with the second series circuit. With this configuration, the anti-resonant frequency of the second series circuit can be preferentially adjusted to the low-frequency side.

Hereinafter, the method of adjusting the resonant frequency and anti-resonant frequency of the resonant circuit 2 according to the second embodiment will be described. In the resonant circuit 2 illustrated in FIG. 3, the resonant frequency and the anti-resonant frequency are adjusted (varied) by connecting the inductor Ls2, the inductor Lp2, the variable capacitor Cs2, and the variable capacitor Cp2 to the resonator 12, in this sequence.

Figure 4:
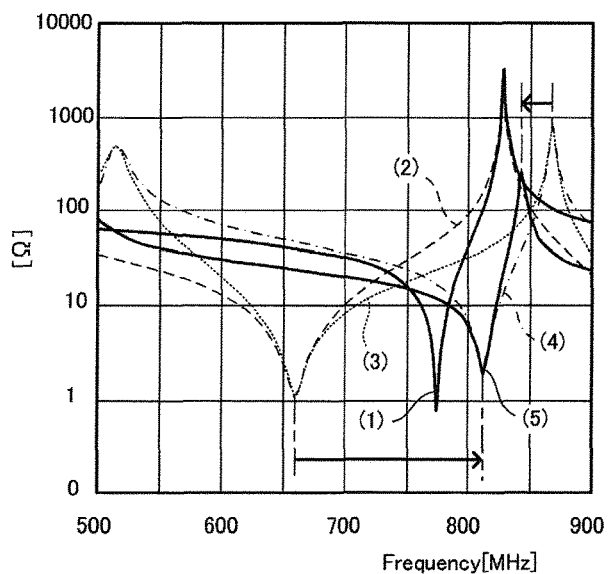
FIG. 4 is a diagram illustrating impedance characteristics in the case where devices are connected to a resonator in sequence.

FIG. 4 is a diagram illustrating the impedance characteristics in the case where the devices are connected to the resonator 12 in sequence. The horizontal axis of FIG. 4 represents frequency [MHz] and the vertical axis represents impedance [Ω].

A waveform (1) illustrated in FIG. 4 shows impedance characteristics of a circuit in which only the resonator 12 is connected between the input/output terminals IO1 and IO2. The resonant frequency of the resonator 12 is about 775 MHz and the anti-resonant frequency is about 825 MHz, as in the resonator 11 according to the first embodiment.

A waveform (2) illustrates the impedance characteristics of the first series circuit in which the inductor Ls2 of 10 nH is connected in series with the resonator 12. In this first series circuit, the resonant frequency is about 660 MHz, and the anti-resonant frequency is about 825 MHz. In other words, the waveform (2) has a lower resonant frequency than and the same anti-resonant frequency as the waveform (1). In the present embodiment, compared with the first embodiment, the resonant frequency can be considerably varied to the low-frequency side in a state where variation in impedance is small.

A waveform (3) illustrates the impedance characteristics of the first parallel circuit in which the inductor Lp2 of 10 nH is connected in parallel with the first series circuit. In this first parallel circuit, the resonant frequency is about 660 MHz and the anti-resonant frequency is about 860 MHz. In other words, the waveform (3) has the same resonant frequency as and a higher anti-resonant frequency than the waveform (2).

A waveform (4) illustrates the impedance characteristics of the second series circuit in which the variable capacitor Cs2 is connected in series with the first parallel circuit. The waveform (4) is a waveform in the case where the variable capacitor Cs2 has a capacitance of 5 pF. In the second series circuit, the resonant frequency is about 826 MHz and the anti-resonant frequency is about 860 MHz. In other words, the waveform (4) has an about 166 MHz higher resonant frequency than and the same anti-resonant frequency as the waveform (3). In the present embodiment, the resonant frequency can be adjusted in a state where variation in impedance is small, compared with the first embodiment.

A waveform (5) illustrates the impedance characteristics of a circuit in which the variable capacitor Cp2 is connected in parallel with the second series circuit, i.e., the impedance characteristics of the resonant circuit 2 according to the second embodiment. The waveform (5) is a waveform in the case where the variable capacitor Cs2 has a capacitance of 5 pF. In the resonant circuit 2, the resonant frequency is about 826 MHz, and the anti-resonant frequency is about 840 MHz. In other words, the waveform (5) has the same resonant frequency as and an about 20 MHz lower anti-resonant frequency than the waveform (4).

When comparing the waveform (5) with the waveform (1), both of the resonant frequency and anti-resonant frequency of the waveform (5) are lower than those of the waveform (1). In other words, the resonant circuit 2 allows both of the resonant frequency and anti-resonant frequency of the resonator 12 to be varied. As a result, the resonant circuit 2 allows both of the band-pass characteristics and attenuation characteristics to be adjusted.

Further, in the present embodiment, after connecting the inductors Lp2 and Ls2 to the resonator 12 and increasing the distance between the resonant frequency and the anti-resonant frequency, the distance between the resonant frequency and the anti-resonant frequency is decreased by connecting the variable capacitors Cp2 and Cs2, as indicated by the arrows in FIG. 4. Hence, as in the first embodiment, the resonant frequency and the anti-resonant frequency that cannot be realized by the resonator 12 alone can be realized and, hence, versatile resonant frequencies and anti-resonant frequencies for a resonant circuit can be realized.

By increasing the distance between the resonant frequency and anti-resonant frequency of the resonator 12 once, a range over which the resonant frequency and anti-resonant frequency can be varied by the variable capacitors Cp2 and Cs2 can be increased.

In this way, in the present embodiment, the resonant circuit 2 which is suitable for more communication signals than in a resonator alone or an existing configuration can be more reliably realized. Note that the resonant circuit 2 according to the present embodiment can considerably change the resonant frequency, compared with the first embodiment and, hence, is effective for a variable filter that allows the center frequency of a pass band or the band width to be changed, or allows the attenuation characteristics to be considerably changed.

Third Embodiment

Figure 5:
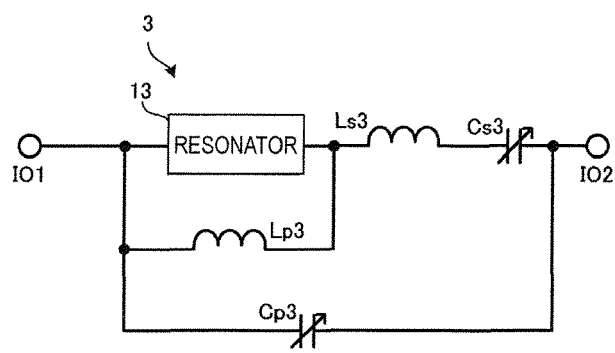
FIG. 5 is a circuit diagram of a resonant circuit 3 according to a third embodiment.

FIG. 5 is a circuit diagram of a resonant circuit 3 according to a third embodiment.

A resonator 13, an inductor Ls3, and a variable capacitor Cs3 are connected in series between input/output terminals IO1 and IO2 of the resonant circuit 3 in sequence from the input/output terminal IO1 side. The inductor Ls3 corresponds to the first inductor according to the present disclosure, and the variable capacitor Cs3 corresponds to the first variable capacitor according to the present disclosure.

An inductor Lp2 is connected in parallel with a resonator 13 (thereby forming a circuit hereinafter called a first parallel circuit in the present embodiment). In more detail, one end of an inductor Lp3 is connected to the input terminal IO1 and the other end is connected to a connection node between the resonator 13 and the inductor Ls3. The inductor Lp3 corresponds to the second inductor according to the present disclosure.

A variable capacitor Cp3 is connected in parallel with the first parallel circuit, the inductor Ls3, and the variable capacitor Cs3 connected in series with one another. The variable capacitor Cp3 corresponds to the second variable capacitor according to the present disclosure.

In the present embodiment, the inductor Lp3 is connected in parallel with the resonator 13. With this configuration, the anti-resonant frequency of the resonator 13 can be preferentially adjusted to the high-frequency side. In addition, in the present embodiment, the inductor Ls3 is connected in series with the first parallel circuit (thereby forming a circuit hereinafter called a first series circuit in the present embodiment). With this configuration, the resonant frequency of the first parallel circuit can be preferentially adjusted to the low-frequency side.

In the present embodiment, the variable capacitor Cs3 is connected in series with the first series circuit (thereby forming a circuit hereinafter called a second series circuit in the present embodiment). With this configuration, the resonant frequency of the first series circuit can be preferentially adjusted to the high-frequency side. Further, in the present embodiment, the variable capacitor Cp3 is connected in parallel with the second series circuit. With this configuration, the anti-resonant frequency of the second series circuit can be preferentially adjusted to the low-frequency side.

Hereinafter, the method of adjusting the resonant frequency and anti-resonant frequency of the resonant circuit 3 according to the third embodiment will be described. In the resonant circuit 3 illustrated in FIG. 5, the resonant frequency and the anti-resonant frequency are adjusted (varied) by connecting the inductor Lp3, the inductor Ls3, the variable capacitor Cs3, and the variable capacitor Cp3 to the resonator 13, in this sequence.

Figure 6:
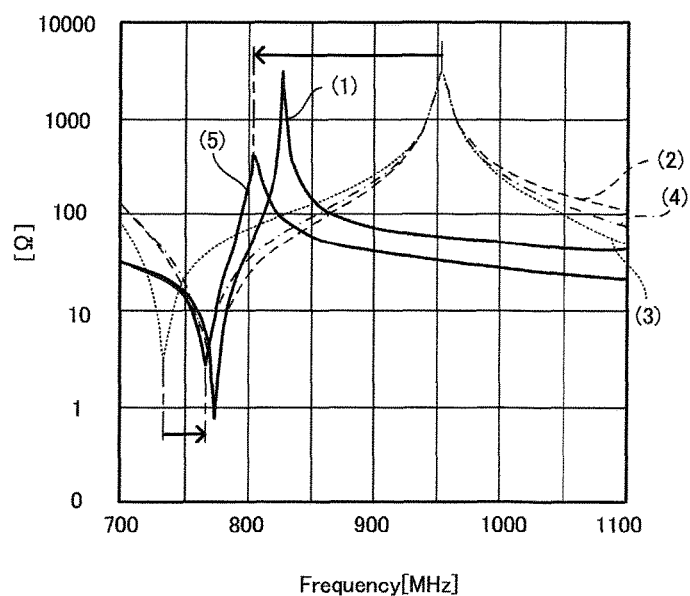
FIG. 6 is a diagram illustrating impedance characteristics in the case where devices are connected to a resonator in sequence.

FIG. 6 is a diagram illustrating the impedance characteristics in the case where the devices are connected to the resonator 13 in sequence. The horizontal axis of FIG. 6 represents frequency [MHz] and the vertical axis represents impedance [Ω].

A waveform (1) illustrated in FIG. 6 shows impedance characteristics of a circuit in which only the resonator 13 is connected between the input/output terminals IO1 and IO2. The resonant frequency of the resonator 13 is about 775 MHz and the anti-resonant frequency is about 825 MHz, as in the resonator 11 according to the first embodiment.

A waveform (2) shows the impedance characteristics of the first parallel circuit in which the inductor Lp3 of 10 nH is connected in parallel with the resonator 13. In this first parallel circuit, the resonant frequency is about 775 MHz, and the anti-resonant frequency is about 955 MHz. In other words, the waveform (2) has the same resonant frequency as and a higher anti-resonant frequency than the waveform (1).

A waveform (3) shows the impedance characteristics of the first series circuit in which the inductor Ls3 of 10 nH is connected in series with the first parallel circuit. In this first series circuit, the resonant frequency is about 730 MHz and the anti-resonant frequency is about 955 MHz. In other words, the waveform (3) has a lower resonant frequency than and the same anti-resonant frequency as the waveform (2).

A waveform (4) shows the impedance characteristics of the second series circuit in which the variable capacitor Cs3 is connected in series with the first series circuit. The waveform (4) is a waveform in the case where the variable capacitor Cs3 has a capacitance of 5 pF. In the second series circuit, the resonant frequency is about 772 MHz and the anti-resonant frequency is about 955 MHz. In other words, the waveform (4) has an about 42 MHz higher resonant frequency than and the same anti-resonant frequency as the waveform (3).

A waveform (5) shows the impedance characteristics of a circuit in which the variable capacitor Cp3 is connected in parallel with the second series circuit, i.e., the impedance characteristics of the resonant circuit 3 according to the third embodiment. The waveform (5) is a waveform in the case where the variable capacitor Cp3 has a capacitance of 5 pF. In the resonant circuit 3, the resonant frequency is about 772 MHz and the anti-resonant frequency is about 805 MHz. In other words, the waveform (5) has the same resonant frequency as and an about 150 MHz lower anti-resonant frequency than the waveform (4).

The present embodiment is different from the resonant circuit 1 according to the first embodiment in terms of the connection relationship between the first variable capacitor and the second variable capacitor. As a result, the resonant circuit 3 according to the present embodiment has a higher anti-resonant frequency than the resonant circuit 1 of the first embodiment in which the resonant frequency is about 777 MHz. Further, the resonant circuit 3 according to the present embodiment has a higher resonant frequency than the resonant circuit 1 of the first embodiment in which the resonant frequency is about 751 MHz.

The waveform (5) has a lower resonant frequency and a lower anti-resonant frequency than the waveform (1). In other words, the resonant circuit 3 allows both of the resonant frequency and anti-resonant frequency of the resonator 13 to be variable. As a result, the resonant circuit 3 allows both of the band-pass characteristics and the attenuation characteristics to be adjusted.

In the present embodiment, after connecting the inductors Lp3 and Ls3 to the resonator 13 and increasing the distance between the resonant frequency and the anti-resonant frequency, the distance between the resonant frequency and the anti-resonant frequency is decreased by connection of the variable capacitors Cp3 and Cs3, as indicated by the arrows in FIG. 6. Hence, as in the first embodiment, the resonant frequency and the anti-resonant frequency that cannot be realized by the resonator 12 alone can be realized and, hence, versatile resonant frequencies and anti-resonant frequencies for a resonant circuit can be realized.

By increasing the distance between the resonant frequency and anti-resonant frequency of the resonator 13 once, a range over which the resonant frequency and the anti-resonant frequency can be varied by the variable capacitors Cp3 and Cs3 can be increased.

In this way, in the present embodiment, the resonant circuit 3 which is suitable for more communication signals than in a resonator alone or an existing configuration can be more reliably realized.

Fourth Embodiment

Figure 7:
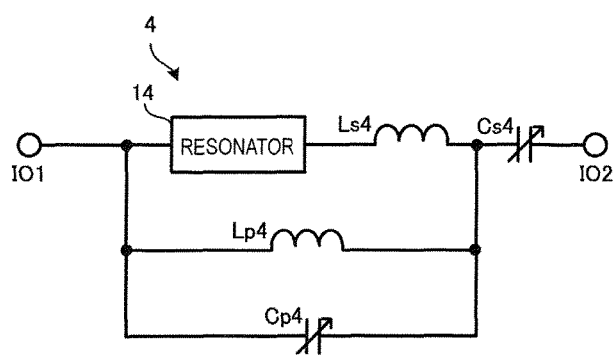
FIG. 7 is a circuit diagram of a resonant circuit 4 according to a fourth embodiment.

FIG. 7 is a circuit diagram of a resonant circuit 4 according to a fourth embodiment.

A resonator 14, an inductor Ls4, and a variable capacitor Cs4 are connected in series between input/output terminals IO1 and IO2 of the resonant circuit 4 in sequence from the input/output terminal IO1 side. The inductor Ls4 corresponds to the first inductor according to the present disclosure, and the variable capacitor Cs4 corresponds to the first variable capacitor according to the present disclosure.

An inductor Lp4 is connected in parallel with a series circuit (hereinafter, called a first series circuit in the present embodiment) formed of the resonator 14 and the inductor Ls4. In more detail, one end of the inductor Lp4 is connected to the input terminal IO1 and the other end is connected to a connection node between the inductor Ls4 and the variable capacitor Cs4. The inductor Lp4 corresponds to the second inductor of the present disclosure.

Further, a variable capacitor Cp4 is connected in parallel with the first series circuit and the inductor Lp4. The variable capacitor Cp4 corresponds to the second variable capacitor of the present disclosure.

In the present embodiment, the inductor Ls4 is connected in series with the resonator 14. With this configuration, the resonant frequency of the resonator 14 can be preferentially adjusted to the low-frequency side. Further, in the present embodiment, the inductor Lp4 is connected in parallel with the first series circuit (thereby forming a circuit hereinafter called a first parallel circuit in the present embodiment). With this configuration, the anti-resonant frequency of the first series circuit can be preferentially adjusted to the high-frequency side.

In the present embodiment, the variable capacitor Cp4 is connected in parallel with the first parallel circuit and the inductor Lp4 (thereby forming a circuit hereinafter called a second parallel circuit). With this configuration, the anti-resonant frequency of the first parallel circuit can be preferentially adjusted to the low-frequency side. Further, in the present embodiment, the variable capacitor Cs4 is connected in series with the second parallel circuit. With this configuration, the resonant frequency of the second parallel circuit can be preferentially adjusted to the high-frequency side.

Hereinafter, the method of adjusting the resonant frequency and anti-resonant frequency of the resonant circuit 4 according to the fourth embodiment will be described. In the resonant circuit 4 illustrated in FIG. 7, the resonant frequency and the anti-resonant frequency are adjusted (varied) by connecting the inductor Ls4, the inductor Lp4, the variable capacitor Cp4, and the variable capacitor Cs4 to the resonator 14, in this sequence.

Figure 8:
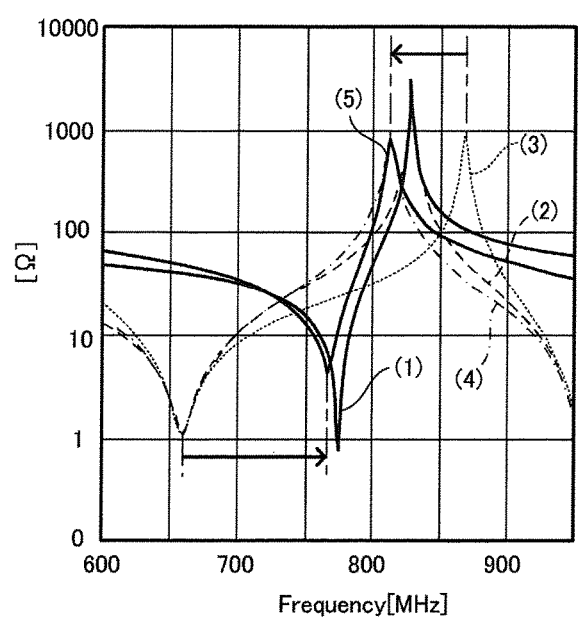
FIG. 8 is a diagram illustrating impedance characteristics in the case where devices are connected to a resonator in sequence.

FIG. 8 is a diagram illustrating the impedance characteristics in the case where the devices are connected to the resonator 14 in sequence. The horizontal axis of FIG. 8 represents frequency [MHz] and the vertical axis represents impedance [Ω].

A waveform (1) illustrated in FIG. 8 shows the impedance characteristics of a circuit in which only the resonator 14 is connected between the input/output terminals IO1 and IO2. The resonant frequency of the resonator 14 is about 775 MHz and the anti-resonant frequency is about 825 MHz, as in the resonator 11 according to the first embodiment.

A waveform (2) shows the impedance characteristics of the first series circuit in which the inductor Ls4 of 10 nH is connected in series with the resonator 14. In this first series circuit, the resonant frequency is about 655 MHz, and the anti-resonant frequency is about 825 MHz. In other words, the waveform (2) has a lower resonant frequency than and the same anti-resonant frequency as the waveform (1). In this embodiment, the resonant frequency can be considerably varied to the low-frequency side in a state in which variation in impedance is small, compared with the first embodiment.

A waveform (3) shows the impedance characteristics of the first parallel circuit in which the inductor Lp4 of 10 nH is connected in parallel with the first series circuit. In this first parallel circuit, the resonant frequency is about 655 MHz and the anti-resonant frequency is about 860 MHz. In other words, the waveform (3) has the same resonant frequency as and a higher anti-resonant frequency than the waveform (2).

A waveform (4) shows the impedance characteristics of the second parallel circuit in which the variable capacitor Cp4 is connected in parallel with the first parallel circuit. The waveform (4) is a waveform in the case where the variable capacitor Cp4 has a capacitance of 5 pF. In the second parallel circuit, the resonant frequency is about 655 MHz, and the anti-resonant frequency is about 817 MHz. In other words, the waveform (4) has the same resonant frequency as and an about 43 MHz lower anti-resonant frequency than the waveform (3).

A waveform (5) shows the impedance characteristics of a circuit in which the variable capacitor Cs4 is connected in series with the second parallel circuit, i.e., the impedance characteristics of the resonant circuit 4 according to the fourth embodiment. The waveform (5) is a waveform in the case where the variable capacitor Cs4 has a capacitance of 5 pF. In the resonant circuit 4, the resonant frequency is about 770 MHz, and the anti-resonant frequency is about 825 MHz. In other words, the waveform (5) has an about 115 MHz higher resonant frequency than and the same resonant frequency as the waveform (4).

The present embodiment is different from the resonant circuit 2 according to the second embodiment in terms of the connection relationship between the first variable capacitor and the second variable capacitor. As a result, in the resonant circuit 4 according to the present embodiment, the anti-resonant frequency is lower than in the resonant circuit 1 according to the first embodiment where the anti-resonant frequency is about 840 MHz. Further, in the resonant circuit 3 according to the present embodiment, the resonant frequency is lower than in the resonant circuit 2 according to the second embodiment where the resonant frequency is about 826 MHz.

In the waveform (5), both of the resonant frequency and anti-resonant frequency are lower than those of the waveform (1). In other words, the resonant circuit 4 allows both of the resonant frequency and anti-resonant frequency of the resonator 14 to be varied. As a result, the resonant circuit 4 allows both of the band-pass characteristics and attenuation characteristics to be adjusted.

In the present embodiment, after increasing the distance between the resonant frequency and the anti-resonant frequency by connecting the inductors Lp4 and Ls4 to the resonator 14, the distance between the resonant frequency and the anti-resonant frequency is decreased by connection of the variable capacitors Cp4 and Cs4 as indicated by the arrows in FIG. 8. Hence, as in the first embodiment, the resonant frequency and anti-resonant frequency that cannot be realized by the resonator 14 alone can be realized and, hence, versatile resonant frequencies and anti-resonant frequencies for a resonant circuit can be realized.

By increasing the distance between the resonant frequency and the anti-resonant frequency of the resonator 14 once, a range over which the resonant frequency and the anti-resonant frequency can be varied by the variable capacitors Cp4 and Cs4 can be increased.

In this way, in the present embodiment, the resonant circuit 4 which is suitable for more communication signals than in a resonator alone or an existing configuration can be more reliably realized.

The circuits of the first to four embodiments have been described above. Different resonant frequencies, anti-resonant frequencies, and modification ranges can be obtained by using the same devices having the same values by changing the device connection configurations. Hence, a resonant circuit suitable for more communication signals can be realized by changing the connection configuration, while using the same devices.

Fifth Embodiment

Hereinafter, a high-frequency filter including resonant circuits according to the present disclosure will be described.

Figure 9:
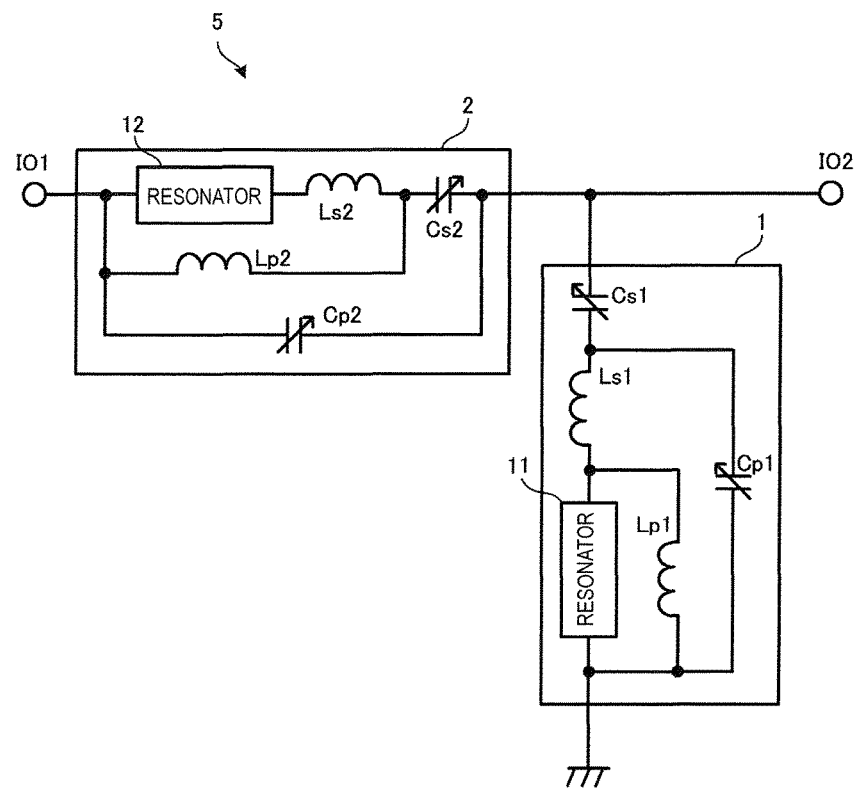
FIG. 9 is a circuit diagram of a high-frequency filter according to a fifth embodiment.

FIG. 9 is a circuit diagram of a high-frequency filter according to a fifth embodiment. A high-frequency filter 5 according to the present embodiment includes the resonant circuit 1 according to the first embodiment and the resonant circuit 2 according to the second embodiment. The resonant circuit 2 is connected on a signal line between the input/output terminals IO1 and IO2. One end of the resonant circuit 1 is connected to the output terminal IO2, and the other end is connected to the ground.

Figure 10:
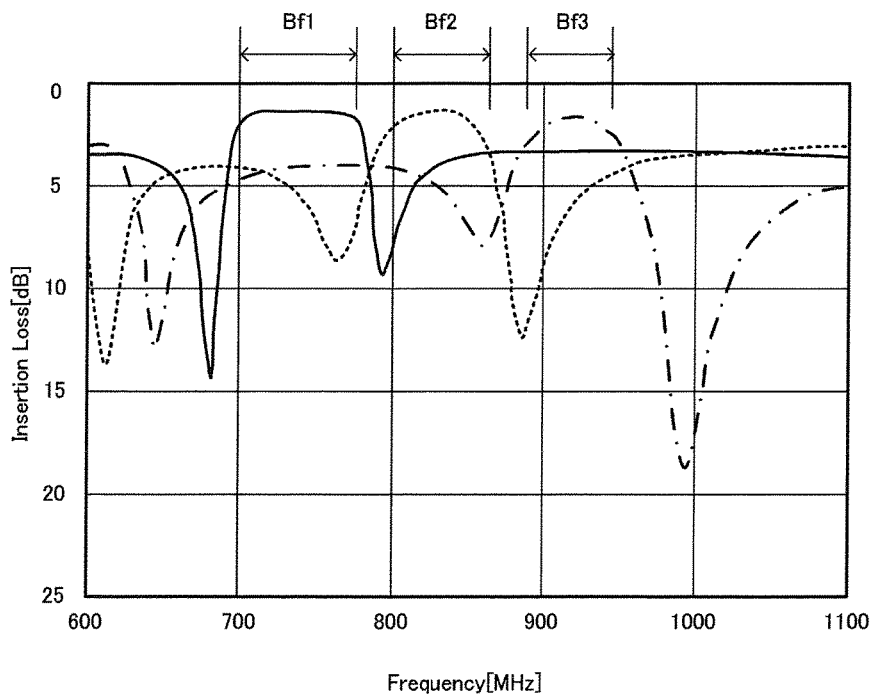
FIG. 10 is a diagram illustrating the pass-band characteristics of the high-frequency filter illustrated in FIG. 9.

FIG. 10 is a diagram illustrating the pass-band characteristics of the high-frequency filter 5 illustrated in FIG. 9. In this example, the resonator 11 of the resonant circuit 1 has a center frequency of 720 MHz and a characteristic impedance of 50Ω. In the resonator 12 of the resonant circuit 2, the center frequency is 800 MHz, and the characteristic impedance is 120Ω. Further, Ls1=5 nH, Lp1=4 nH, Ls2=9 nH, and Lp2=9 nH.

The solid line in the figure represents a waveform showing an insertion loss in the case where Cs1=5 pF, Cp1=5 pF, Cs2=12 pF, and Cp2=12 pF. The broken line in the figure represents a waveform showing an insertion loss in the case where Cs1=1.7 pF, Cp1=3 pF, Cs2=6 pF, and Cp2=6 pF. The one-dot chain line in the figure represents a waveform showing an insertion loss in the case where Cs1=1.2 pF, Cp1=2 pF, Cs2=3.5 pF, and Cp2=2 pF.

As can be seen from FIG. 10, a pass band Bf1 is about 700 to 780 MHz in the case of the solid line, a pass band Bf2 is about 800 to 860 MHz in the case of the broken line, and a pass band Bf3 is about 890 to 940 MHz in the case of the one-dot chain line. Insertion losses in these characteristics are about the same (about 2 dB). In this way, the high-frequency filter 5 allows the pass band to be shifted with almost no change in loss by adjusting the capacitance of the variable capacitors Cp1, Cs1, Cp2, and Cs2 through a combination of the resonant circuits 1 and 2. In other words, a band pass filter having a low insertion loss and a variable band can be realized.

Sixth Embodiment

Hereinafter, a high-frequency filter including resonant circuits according to the present disclosure will be described.

Figure 11:
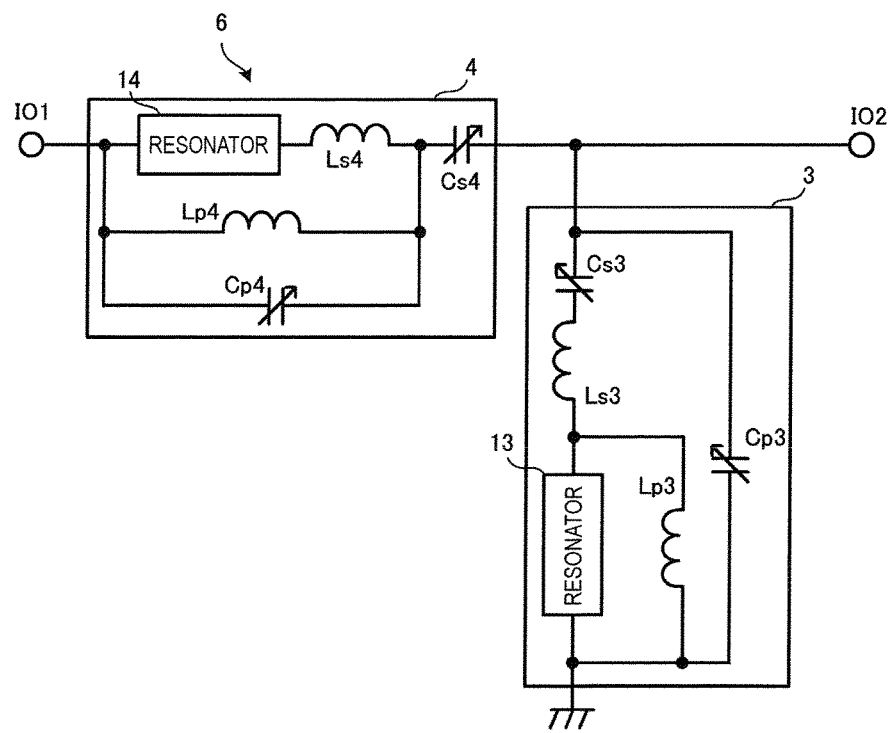
FIG. 11 is a circuit diagram of a high-frequency filter according to a sixth embodiment.

FIG. 11 is a circuit diagram of a high-frequency filter according to a sixth embodiment. A high-frequency filter 6 according to the present embodiment includes the resonant circuit 3 according to the third embodiment and the resonant circuit 4 according to the fourth embodiment. The resonant circuit 4 is connected on a signal line between the input/output terminals IO1 and IO2. One end of the resonant circuit 3 is connected to the signal line, and the other end is connected to the ground.

Figure 12:
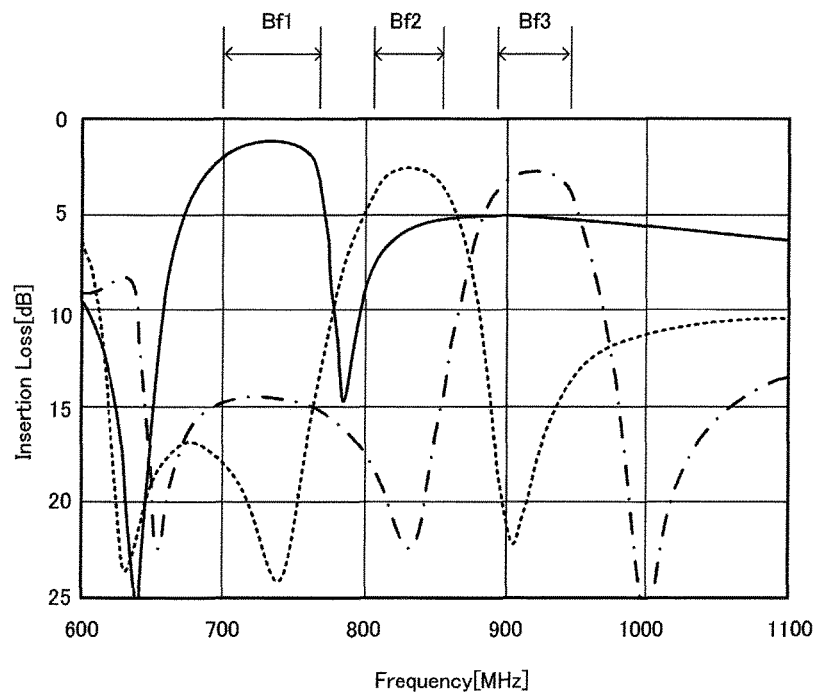
FIG. 12 is a diagram illustrating the pass-band characteristics of the high-frequency filter illustrated in FIG. 11.

FIG. 12 is a diagram illustrating the pass-band characteristics of the high-frequency filter 6 illustrated in FIG. 11. In this example, the resonator 13 of the resonant circuit 3 has a center frequency of 670 MHz and a characteristic impedance of 50Ω. In the resonator 14 of the resonant circuit 4, the center frequency is 800 MHz, and the characteristic impedance is 80Ω. Further, Ls3=5 nH, Lp3=5 nH, Ls4=5 nH, and Lp4=6 nH.

The solid line in the figure represents a waveform showing an insertion loss in the case where Cs3=10 pF, Cp3=8 pF, Cs4=12 pF, and Cp4=10 pF. The broken line in the figure represents a waveform showing an insertion loss in the case where Cs3=4.2 pF, Cp3=7.0 pF, Cs4=2.5 pF, and Cp4=4.0 pF. The one-dot chain line in the figure represents a waveform showing an insertion loss in the case where Cs3=2.7 pF, Cp3=6.0 pF, Cs4=1.5 pF, and Cp4=2.0 pF.

As can be seen from FIG. 12, the pass band Bf1 is about 700 to 760 MHz in the case of the solid line, the pass band Bf2 is about 810 to 860 MHz in the case of the broken line, and the pass band Bf3 is about 890 to 940 MHz in the case of the one-dot chain line. Insertion losses in these characteristics are about the same (about 2 dB). In this way, the high-frequency filter 6 allows the pass band to be shifted with almost no change in loss by adjusting the capacitance of the variable capacitors Cp1, Cs1, Cp2, and Cs2 through a combination of the resonant circuits 3 and 4. In other words, a band pass filter having a low loss and a variable band can be realized.

Note that, as described in the fifth and sixth embodiments, in the case where a high-frequency filter is formed by a combination of two resonant circuits, it becomes easy to realize desired filter characteristics by appropriate selection of resonant circuits to be combined. For example, a band pass filter whose pass band can be varied over a wide range can be realized by a configuration in which a resonant circuit whose resonant frequency can be varied over a wide range is connected in series and a resonant circuit whose anti-resonant frequency can be varied over a wide range is connected in parallel.

REFERENCE SIGNS LIST 1, 2, 3, 4 resonant circuits
5, 6 high-frequency filters
11 to 14 resonators
Cp1 to Cp4 variable capacitors
Cs1 to Cs4 variable capacitors
Lp1 to Lp4 inductors
Ls1 to Ls4 inductors
IO1 input/output terminal
IO2 input/output terminal

The invention claimed is:

1. A resonant circuit comprising:
a resonator, a first inductor, and a first variable capacitor connected in series between a first input/output (IO) terminal and a second IO terminal, wherein the resonator is connected at one end to the first IO terminal and the first variable capacitor is connected at one end to the second IO terminal;
a second inductor connected in parallel with at least the resonator; and
a second variable capacitor connected in parallel with at least the resonator and the first inductor,
wherein the second inductor is connected to the first IO terminal and to a node between the first inductor and the first variable capacitor, and
the second variable capacitor is connected to the first IO terminal and to the second IO terminal.

2. The resonant circuit according to claim 1, wherein the resonator is a surface acoustic wave resonator.

3. The resonant circuit according to claim 1, wherein the resonator is a bulk acoustic wave resonator.

4. A high-frequency filter comprising:
a first resonant circuit comprising:
a first resonator, a first inductor, and a first variable capacitor connected in series between a first input/output (IO) terminal and a second IO terminal, wherein the first resonator is connected at one end to the first IO terminal and the first variable capacitor is connected at one end to the second IO terminal;
a second inductor connected in parallel with at least the first resonator; and
a second variable capacitor connected in parallel with at least the first resonator and the first inductor, and
a second resonant circuit comprising:
a second resonator, a third inductor, and a third variable capacitor connected in series between ground and the second IO terminal, wherein the second resonator is connected at one end to ground and the third variable capacitor is connected at one end to the second IO terminal;
a fourth inductor connected in parallel with at least the second resonator; and
a fourth variable capacitor connected in parallel with at least the second resonator and the third inductor,
wherein the first resonant circuit has a different pass band and different attenuation band than the second resonant circuit.

5. The high-frequency filter according to claim 4, wherein:
the second inductor is connected in parallel with the first resonator and the first inductor;
the second variable capacitor is connected in parallel with the first resonator, the first inductor, and the first variable capacitor;
the fourth inductor is connected in parallel with the second resonator; and
the fourth variable capacitor is connected in parallel with the second resonator and the third inductor.

6. The high-frequency filter according to claim 4, wherein:
the second inductor is connected in parallel with the first resonator and the first inductor;

the second variable capacitor is connected in parallel with the first resonator and the first inductor;

the fourth inductor is connected in parallel with the second resonator; and the fourth variable capacitor is connected in parallel with the second resonator, the third inductor, and the third variable capacitor.

7. A resonant circuit comprising:

a resonator, a first inductor, and a first variable capacitor connected in series between a first input/output (IO) terminal and a second IO terminal, wherein the resonator is connected at one end to the first IO terminal and the first variable capacitor is connected at one end to the second IO terminal;

a second inductor connected in parallel with at least the resonator; and a second variable capacitor connected in parallel with at least the resonator and the first inductor, wherein the second inductor is connected to the first IO terminal and to a node between the first inductor and the first variable capacitor, and the second variable capacitor is connected to the first IO terminal and to a node between the first inductor and the first variable capacitor.

* * * * *